United States Patent
Kim et al.

(10) Patent No.: US 11,368,152 B2
(45) Date of Patent: Jun. 21, 2022

(54) SOURCE SIGNAL OUTPUT CIRCUIT AND INVERTER THEREOF

(71) Applicant: Silicon Works Co., Ltd., Daejeon (KR)

(72) Inventors: Young Tae Kim, Daejeon (KR); Young Bok Kim, Daejeon (KR); Taiming Piao, Daejeon (KR); Dong Hun Lee, Daejeon (KR)

(73) Assignee: Silicon Works Co., Ltd

( * ) Notice: Subject to any disclaimer, the term of this patent is extended or adjusted under 35 U.S.C. 154(b) by 0 days.

(21) Appl. No.: 17/222,501

(22) Filed: Apr. 5, 2021

(65) Prior Publication Data

US 2021/0320654 A1 Oct. 14, 2021

(30) Foreign Application Priority Data

Apr. 8, 2020 (KR) ........................ 10-2020-0042706

(51) Int. Cl.
*H03K 17/693* (2006.01)
*H03K 17/687* (2006.01)
*H03K 19/20* (2006.01)
*G09G 3/20* (2006.01)

(52) U.S. Cl.
CPC ..... *H03K 17/6872* (2013.01); *H03K 17/6874* (2013.01); *H03K 19/20* (2013.01); *G09G 3/20* (2013.01); *G09G 2310/0297* (2013.01)

(58) Field of Classification Search
CPC combination set(s) only.
See application file for complete search history.

(56) References Cited

U.S. PATENT DOCUMENTS

| 7,880,527 | B2 * | 2/2011 | Taddiken | ....... H03K 19/018521 327/333 |
| 8,138,815 | B2 * | 3/2012 | Taddiken | ......... H03K 19/00315 327/333 |
| 2011/0109370 | A1 * | 5/2011 | Taddiken | ......... H03K 19/00315 327/333 |

FOREIGN PATENT DOCUMENTS

| KR | 2014-0017287 B1 | 2/2014 |
| KR | 2014-0125975 B1 | 10/2014 |
| KR | 2016-0026038 A | 3/2016 |

\* cited by examiner

*Primary Examiner* — Long Nguyen
(74) *Attorney, Agent, or Firm* — Polsinelli PC

(57) ABSTRACT

The present disclosure discloses a source signal output circuit and an inverter thereof. The inverter is configured to provide a multiplexer with a control signal having a full range for selecting a source signal and to output the control signal having the full range by using elements operating in a low voltage range. Therefore, the present disclosure has an advantage in that it can fabricate a driving circuit having a small area at a low process cost.

13 Claims, 3 Drawing Sheets

SOURCE SIGNAL OUTPUT CIRCUIT AND INVERTER THEREOF

BACKGROUND

1. Technical Field

The present disclosure relates to a driving circuit for a display device, and more particularly, to an inverter which provides a control signal having a full range for selecting a source signal and a source signal output circuit which selects and outputs the source signal by using the inverter.

2. Related Art

A display device includes a driving circuit for driving a display panel, such as an LCD panel or an LED panel. The driving circuit may be fabricated as an integrated circuit and mounted on the display device.

The driving circuit is for receiving display data for representing a screen, generating a source signal corresponding to the display data, and providing the source signal to the display panel.

The driving circuit has been variously developed in order to reduce the area of the driving circuit and improve an operating characteristic thereof.

For example, the driving circuit includes an output buffer that generates a source signal. The output buffer may be designed to generate the source signal having a full range by using an intermediate voltage of a driving voltage and a ground voltage. In this case, the full range may be understood to mean a voltage between the driving voltage and the ground voltage.

Furthermore, the driving circuit includes a multiplexer for transmitting the source signal of the output buffer to the display panel. The multiplexer is configured to select and output the source signal having the full range in response to a control signal.

In the driving circuit, the output buffer may be configured using transistors operating in a low voltage range in order to reduce the area and a process cost of the driving circuit. In this case, the low voltage range may be understood to mean a voltage range from the driving voltage to the intermediate voltage or a voltage range from the intermediate voltage to the ground voltage.

The transistors operating in the low voltage range occupies a small area and can reduce a process cost, compared to transistors operating in a full range.

The driving circuit includes an inverter for providing the multiplexer with a control signal having a full range. The inverter is configured to provide the control signal to the multiplexer.

In general, the inverter provides a control signal having a full range by using a driving voltage and a ground voltage, and is configured using transistors operating in the full range.

In the driving circuit, not only the output buffer, but the inverter needs to be configured using transistors operating in a low voltage range so that the driving circuit can be fabricated to have a small area at a low process cost.

SUMMARY

Various embodiments are directed to providing an inverter of a source signal output circuit, which includes elements operating in a low voltage range and may output a control signal having a full range for selecting and outputting a source signal.

Furthermore, various embodiments are directed to providing a source signal output circuit capable of controlling a multiplexer by using the inverter.

In an embodiment, a source signal output circuit may include a multiplexer configured to select a source signal having a first voltage range from a first voltage to a second voltage in response to a control signal and an inverter configured to output the control signal by using an intermediate voltage between the first voltage and the second voltage. The inverter includes a first inverting unit configured to provide a first inverting signal having a second voltage range from the first voltage to the intermediate voltage in response to a first input signal, a second inverting unit configured to provide a second inverting signal having a third voltage range from the intermediate voltage to the second voltage in response to a second input signal, and an output unit configured to provide the control signal having the first voltage range by outputting one of the first inverting signal and the second inverting signal.

Furthermore, an inverter of a source signal output circuit may include a first inverting unit configured to provide a first inverting signal in response to a first input signal, a second inverting unit configured to provide a second inverting signal in response to a second input signal and an output unit configured to select one of the first inverting signal and the second inverting signal and output the selected signal as the control signal. The control signal belongs to a first voltage range from a first voltage to a second voltage. The first inverting unit uses an intermediate voltage between the first voltage and the second voltage and outputs the first inverting signal having a second voltage range from the first voltage to the intermediate voltage. The second inverting unit uses the intermediate voltage and outputs the second inverting signal having a third voltage range from the intermediate voltage to the second voltage. The first inverting unit, the second inverting unit and the output unit are configured to operate in a low voltage range smaller than the first voltage range.

The present disclosure has an advantage in that it can fabricate a driving circuit having a small area at a low process cost because the inverter for providing the multiplexer with a control signal having a full range is configured using elements operating in a low voltage range.

DETAILED DESCRIPTION

Figure 1:
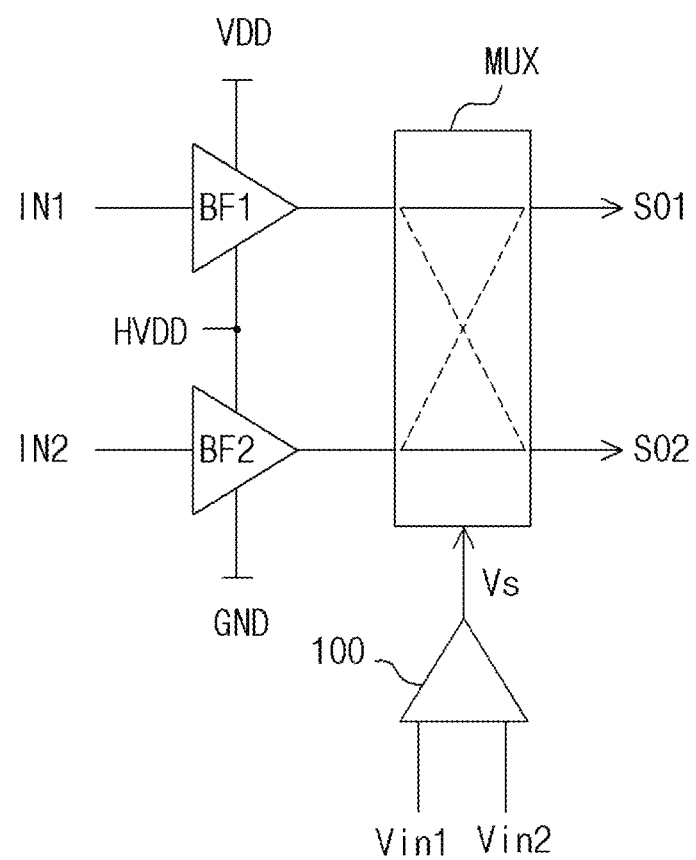
FIG. 1 is a circuit diagram illustrating a preferred embodiment of a source signal output circuit according to the present disclosure.

Exemplary embodiments will be described below in more detail with reference to the accompanying drawings. The disclosure may, however, be embodied in different forms and should not be constructed as limited to the embodiments set forth herein. Rather, these embodiments are provided so that this disclosure will be thorough and complete, and will fully convey the scope of the disclosure to those skilled in the art. Throughout the disclosure, like reference numerals refer to like parts throughout the various figures and embodiments of the disclosure.

A source signal output circuit of the present disclosure may be described with reference to FIG. 1.

The source signal output circuit forms a part of a driving circuit fabricated as an integrated circuit, and may be illustrated as including output buffers BF1 and BF2, a multiplexer MUX and an inverter 100.

The source signal output circuit is illustrated as using a driving voltage VDD as a first voltage, using a ground voltage GND as a second voltage, and using a half driving voltage HVDD as an intermediate voltage. In this case, the intermediate voltage may be understood to have an intermediate level between the driving voltage VDD and the ground voltage GND, for example.

For a description of the present disclosure, a full range is represented as a first voltage range, and may be understood to be between the driving voltage VDD, that is, the first voltage, and the ground voltage GND, that is, the second voltage. A second voltage range may be understood to be between the driving voltage VDD, that is, the first voltage, and the half driving voltage HVDD, that is, the intermediate voltage. A third voltage range may be understood to be between the half driving voltage HVDD, that is, the intermediate voltage, and the ground voltage GND, that is, the second voltage.

For convenience of description, VDD is represented as the first voltage, GND is represented as the second voltage, and HVDD is represented as the intermediate voltage.

The output buffer BF1 is configured to receive a first input voltage IN1 and to output a source signal SO1 corresponding to the first input voltage IN1 by using the first voltage VDD and the intermediate voltage HVDD.

The output buffer BF2 is configured to receive a second input voltage IN2 and to output a source signal SO2 corresponding to the second input voltage IN2 by using the intermediate voltage HVDD and the second voltage GND.

That is, the output buffer BF1 outputs the source signal SO1 having the first voltage range. The output buffer BF2 outputs the source signal SO2 having the second voltage range.

The multiplexer MUX selects output directions of the source signal SO1 of the output buffer BF1 and the source signal SO2 of the output buffer BF2 and outputs the source signal SO1 and the source signal SO2, in response to a control signal Vs. In FIG. 1, the multiplexer MUX is illustrated as directly outputting the source signal SO1 and the source signal SO2 with respect to two output channels. On the other hand, the multiplexer MUX may change channels, from which the source signal SO1 and the source signal SO2 are output, by crossing connections between the two output channels and the output buffers BF1 and BF2 as indicated by broken lines.

That is, the multiplexer MUX is configured to output the source signals in the first voltage range, that is, the full range, for each output terminal. To this end, the control signal Vs also needs to be provided to have the first voltage range, that is, the full range. If the control signal Vs has the first voltage range, it may be understood that the control signal Vs has a level that swings between the first voltage VDD, that is, the highest level of the first voltage range, and the second voltage GND, that is, the lowest level of the first voltage range.

The second voltage range and the third voltage range may be understood to belong to the first voltage range. The control signal Vs having the second voltage range may be understood to have a high level corresponding to the first voltage VDD. The control signal Vs having the third voltage range may be understood to have a low level corresponding to the second voltage GND.

That is, for example, the multiplexer MUX may directly output the source signal SO1 and the source signal SO2 when the control signal Vs is provided as the first voltage VDD having a high level, and may output the source signal SO1 and the source signal SO2 by crossing them when the control signal Vs is provided as the second voltage GND having a low level.

The inverter 100 is configured to receive a first input signal Vin1 and a second input signal Vin2 and to output the control signal Vs based on values of the first input signal Vin1 and the second input signal Vin2.

Figure 2:
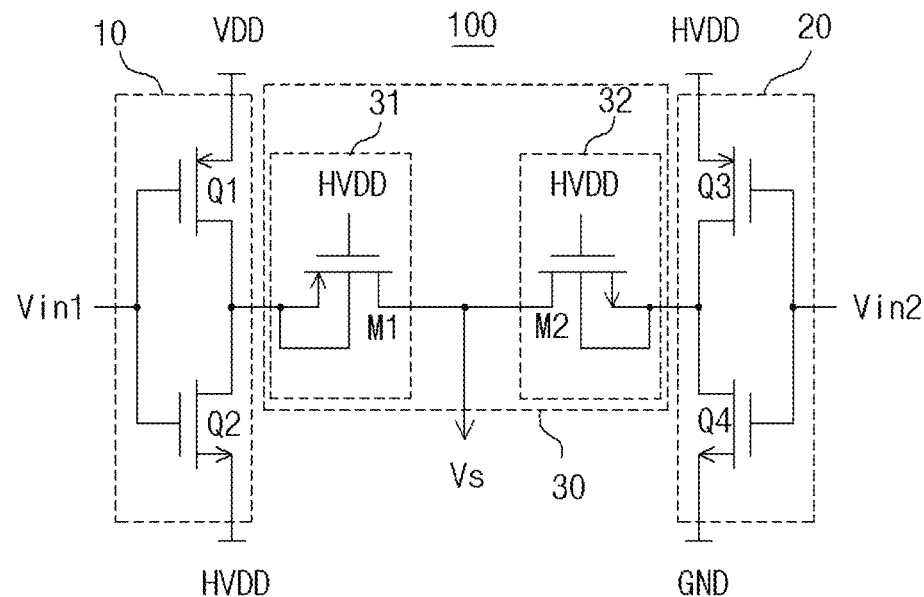
FIG. 2 is a circuit diagram illustrating an embodiment of an inverter of FIG. 1.

Referring to FIG. 2, the inverter 100 is configured to output the control signal Vs by using the intermediate voltage HVDD between the first voltage VDD and the second voltage GND.

To this end, the inverter 100 may be configured to include a first inverting unit 10, a second inverting unit 20 and an output unit 30

The first inverting unit 10 is configured to provide a first inverting signal having the second voltage range from the first voltage VDD to the intermediate voltage HVDD in response to the first input signal Vin1.

Furthermore, the second inverting unit 20 is configured to provide a second inverting signal having the third voltage range from the intermediate voltage HVDD to the second voltage GND in response to the second input signal Vin2.

More specifically, the first inverting unit 10 is configured to include a first pull-up element and a first pull-down element which receive the first input signal Vin1 and output the first inverting signal by using the first voltage VDD and the intermediate voltage HVDD. In this case, the first pull-up element corresponds to a PMOS transistor Q1, and the first pull-down element corresponds to an NMOS transistor Q2.

The PMOS transistor Q1 is configured to have a source to which the first voltage VDD is applied, and a gate to which the first input signal Vin1 is applied, and output the first inverting signal through a drain thereof. The NMOS transistor Q2 is configured to have a source to which the intermediate voltage HVDD is applied, a gate to which the first input signal Vin1 is applied, and a drain coupled to the drain of the PMOS transistor Q1 in common.

According to the configuration, the first inverting unit 10 may be understood to have the PMOS transistor Q1, that is, the first pull-up element, and the NMOS transistor Q2, that is, the first pull-down element, which are configured as a CMOS transistor structure, and to output, through the common drain, the first inverting signal that swings in the second voltage range, that is, between the first voltage VDD and the intermediate voltage HVDD, in response to the first input signal Vin1.

Furthermore, the second inverting unit 20 is configured to include a second pull-up element and a second pull-down element which receive the second input signal Vin2 and output the second inverting signal by using the intermediate voltage HVDD and the second voltage GND. In this case, the second pull-up element corresponds to a PMOS transistor Q3, and the second pull-down element corresponds to an NMOS transistor Q4.

The PMOS transistor Q3 is configured to have a source to which the intermediate voltage HVDD is applied, a gate to which the second input signal Vin2 is applied, and a drain coupled to a drain of the NMOS transistor Q4 in common. The NMOS transistor Q4 is configured to have a source to which the second voltage GND is applied, and a gate to which the second input signal Vin2 is applied, and output the second inverting signal through the drain thereof.

According to the configuration, the second inverting unit 20 may be understood to have the PMOS transistor Q3, that is, the second pull-up element, and the NMOS transistor Q4, that is, the second pull-down element, which are configured as a CMOS transistor structure, and to output, through the common drain, the second inverting signal that swings in the third voltage range, that is, between the intermediate voltage HVDD and the second voltage GND, in response to the second input signal Vin2.

The output unit 30 is configured to provide the control signal Vs having the first voltage range by selecting one of the first inverting signal of the first inverting unit 10 and the second inverting signal of the second inverting unit 20 and outputting the selected signal.

To this end, the output unit 30 includes a first switching unit 31 and a second switching unit 32.

The first switching unit 31 is configured to output the first inverting signal as the control signal Vs, when the first inverting signal of the first inverting unit 10 belongs to the first voltage range.

To this end, the first switching unit 31 outputs the first inverting signal as the control signal Vs, when a gate voltage is fixed by the intermediate voltage HVDD and a potential difference between the first inverting signal of the first inverting unit 10 and the gate voltage is equal to or higher than a preset level. That is, the first switching unit 31 may be understood to include a PMOS diode, which outputs the control signal Vs through a drain thereof when the intermediate voltage HVDD is applied to a gate of the PMOS diode and the first inverting signal equal to or higher than the intermediate voltage HVDD by the preset level is applied to a source and back bias of the PMOS diode.

More specifically, the first switching unit 31 includes a PMOS transistor M1 configured to function as the PMOS diode. The PMOS transistor M1 is configured to have the gate to which the intermediate voltage HVDD is applied, the source to which the first inverting signal of the first inverting unit 10 is applied, and the back bias coupled to the source, and to output the control signal Vs through the drain thereof.

Furthermore, the second switching unit 32 is configured to output the second inverting signal as the control signal Vs, when the second inverting signal of the second inverting unit 20 belongs to the second voltage range.

To this end, the second switching unit 32 outputs the second inverting signal as the control signal Vs, when a gate voltage is fixed by the intermediate voltage HVDD and a potential difference between the second inverting signal of the second inverting unit 20 and the gate voltage is equal to or higher than a preset level. That is, the second switching unit 32 may be understood to include an NMOS diode, which outputs the control signal Vs through a drain thereof when the intermediate voltage HVDD is applied to a gate of the NMOS diode and the second inverting signal equal to or lower than the intermediate voltage HVDD by the preset level is applied to a source and back bias of the NMOS diode.

More specifically, the second switching unit 32 includes an NMOS transistor M2 configured to function as the NMOS diode. The NMOS transistor M2 is configured to have the gate to which the intermediate voltage HVDD is applied, the source to which the second inverting signal of the second inverting unit 20 is applied, and the back bias coupled to the source, and to output the control signal Vs through the drain thereof.

The PMOS transistor M1 included in the first switching unit 31 and the NMOS transistor M2 included in the second switching unit 32 form a common drain, and are configured to output the control signal Vs through the common drain.

Figure 3:
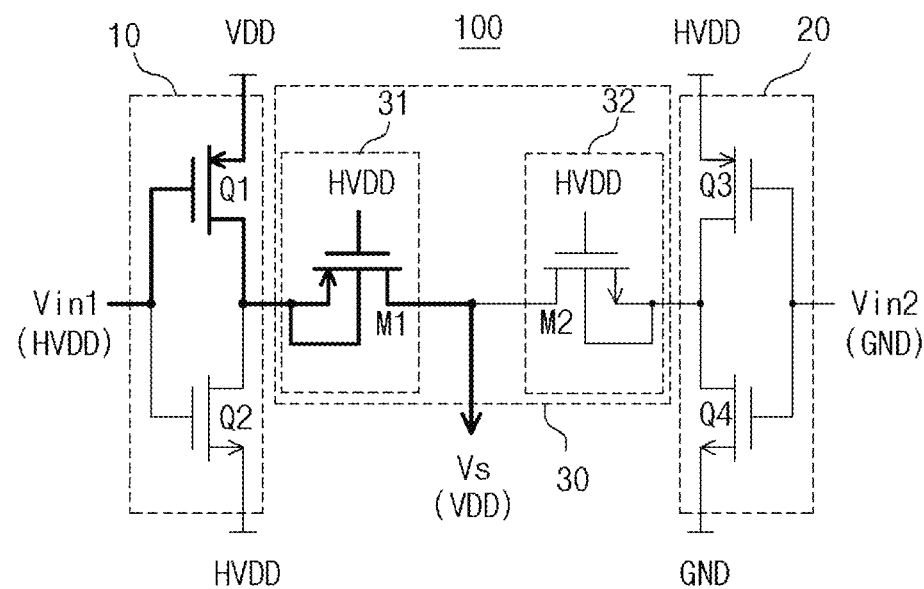
FIG. 3 is a circuit diagram illustrating that the inverter of FIG. 2 outputs a control signal having a voltage range from a driving voltage to an intermediate voltage.
Figure 4:
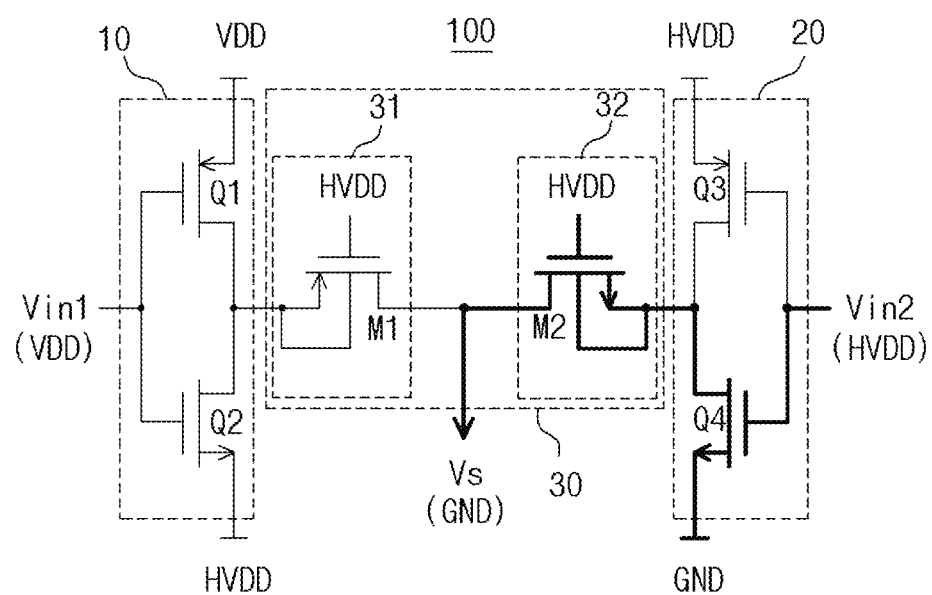
FIG. 4 is a circuit diagram illustrating that the inverter of FIG. 2 outputs a control signal having a voltage range from the intermediate voltage to a ground voltage.

The inverter 100 configured as in FIG. 2 may output the control signal Vs in response to the first input signal Vin1 having the second voltage range as in FIG. 3 or may output the control signal Vs in response to the second input signal Vin2 having the third voltage range as in FIG. 4.

First, referring to FIG. 3, when the first input signal Vin1 is applied as a level of the intermediate voltage HVDD, the second input signal Vin2 is applied as a level of the second voltage GND.

When the second input signal Vin2 is applied as the level of the second voltage GND, the PMOS transistor Q3 is turned on. However, the NMOS transistor M2 remains turned off because the intermediate voltage HVDD is applied to the source and gate of the NMOS transistor M2 and a sufficient voltage for turning on the NMOS transistor M2 is not formed between the gate and the source of the NMOS transistor M2. That is, the second switching unit 32 does not operate.

However, when the first input signal Vin1 is applied as the level of the intermediate voltage HVDD, the PMOS transistor Q1 is turned on. The first inverting signal having the level of the first voltage VDD is applied to the source of the PMOS transistor M1 of the first switching unit 31 by a pull-up operation of the PMOS transistor Q1.

The PMOS transistor M1 of the first switching unit 31 is turned on because the first voltage VDD is applied to the source of the PMOS transistor M1 and a sufficient voltage for turning on the PMOS transistor M1 is formed between the gate and source of the PMOS transistor M1. That is, the first switching unit 31 is turned on, and outputs the control signal Vs having the level of the first voltage VDD, that is, the first inverting signal of the first inverting unit 10.

That is, the control signal Vs is output as the level of the first voltage VDD having the second voltage range by the turn-on of the PMOS transistor Q1 and the PMOS transistor M1.

Referring to FIG. 4, when the first input signal Vin1 is applied as the level of the first voltage VDD, the second input signal Vin2 is applied as the level of the intermediate voltage HVDD.

When the first input signal Vin1 is applied as the level of the first voltage VDD, the NMOS transistor Q2 is turned on. However, the PMOS transistor M1 remains turned off because the intermediate voltage HVDD is applied to the source and gate of the PMOS transistor M1 and a sufficient voltage for turning on the PMOS transistor M1 is not formed between the gate and the source of the PMOS transistor M1. That is, the first switching unit 31 does not operate.

However, when the second input signal Vin2 is applied as the level of the intermediate voltage HVDD, the NMOS transistor Q4 is turned on. The second inverting signal having the level of the second voltage GND is applied to the source of the NMOS transistor M2 of the second switching unit 32 by a pull-down operation of the NMOS transistor Q4.

The NMOS transistor M2 of the second switching unit 32 is turned on because the second voltage GND is applied to the source of the NMOS transistor M2 and a sufficient voltage for turning on the NMOS transistor M2 is formed between the gate and source of NMOS transistor M2. That is, the second switching unit 32 is turned on, and outputs the control signal Vs having the level of the second voltage GND, that is, the second inverting signal of the second inverting unit 20.

That is, the control signal Vs is output as the level of the second voltage GND having the third voltage range by the turn on of the NMOS transistor Q4 and the NMOS transistor M2.

As described above, the control signal Vs may be output as the level of the first voltage VDD or the level of the second voltage GND. That is, the control signal Vs having the first voltage range may be provided to the multiplexer MUX.

Each of the second voltage range from the first voltage VDD to the intermediate voltage HVDD and the third voltage range from the intermediate voltage HVDD to the second voltage GND may be understood to be a low voltage range smaller than the first voltage range from the first voltage VDD to the second voltage GND.

Therefore, the PMOS transistor Q1 and NMOS transistor Q2 of the first inverting unit 10, the PMOS transistor Q3 and NMOS transistor Q4 of the second inverting unit 20, and the PMOS transistor M1 and NMOS transistor M2 of the output unit 30 may be configured to operate in the low voltage range.

The inverter 100 includes elements operating in the low voltage range, and may provide the control signal Vs having the first voltage range, that is, the full range. That is, the inverter 100 can obtain the same effect as that of elements having the full range by using the elements operating in the low voltage range.

Therefore, the present disclosure can implement the source signal output circuit by using not only the buffers BF1 and BF2 corresponding to output buffers, but the inverter 100 as elements operating in the low voltage range.

Accordingly, the present disclosure has an advantage in that it can fabricate a driving circuit having a small area at a low process cost.

While various embodiments have been described above, it will be understood to those skilled in the art that the embodiments described are by way of example only. Accordingly, the disclosure described herein should not be limited based on the described embodiments.

What is claimed is:

1. A source signal output circuit comprising:
   a multiplexer configured to select a source signal having a first voltage range from a first voltage to a second voltage in response to a control signal; and
   an inverter configured to output the control signal by using an intermediate voltage between the first voltage and the second voltage,
   wherein the inverter comprises:
   a first inverting unit configured to provide a first inverting signal having a second voltage range from the first voltage to the intermediate voltage in response to a first input signal;
   a second inverting unit configured to provide a second inverting signal having a third voltage range from the intermediate voltage to the second voltage in response to a second input signal; and
   an output unit configured to provide the control signal having the first voltage range by outputting one of the first inverting signal and the second inverting signal.

2. The source signal output circuit of claim 1, wherein:
   each of the second voltage range and the third voltage range is included in a low voltage range smaller than the first voltage range, and
   the first inverting unit, the second inverting unit and the output unit are configured to operate in the low voltage range.

3. The source signal output circuit of claim 1, wherein:
   the first inverting unit comprises a first pull-up element and a first pull-down element configured to receive the first input signal and output the first inverting signal by using the first voltage and the intermediate voltage, and
   the second inverting unit comprises a second pull-up element and a second pull-down element configured to receive the second input signal and output the second inverting signal by using the intermediate voltage and the second voltage.

4. The source signal output circuit of claim 3, wherein:
   each of the second voltage range and the third voltage range is included in a low voltage range smaller than the first voltage range, and
   the first pull-up element, the first pull-down element, the second pull-up element and the second pull-down element are configured to operate in the low voltage range.

5. The source signal output circuit of claim 1, wherein the output unit comprises:
   a first switching unit configured to output the first inverting signal as the control signal when the first inverting signal of the first inverting unit belongs to the first voltage range; and
   a second switching unit configured to output the second inverting signal as the control signal when the second inverting signal of the second inverting unit belongs to the second voltage range.

6. The source signal output circuit of claim 5, wherein:
   the first switching unit outputs the first inverting signal as the control signal, when a first gate voltage is fixed by the intermediate voltage and a potential difference between the first inverting signal and the first gate voltage is equal to or higher than a first preset level, and
   the second switching unit outputs the second inverting signal as the control signal, when a second gate voltage is fixed by the intermediate voltage and a potential difference between the second inverting signal and the second gate voltage is equal to or higher than a second preset level.

7. The source signal output circuit of claim 5, wherein:
   the first switching unit comprises a PMOS diode configured to output the control signal through a drain thereof when the intermediate voltage is applied to a first gate of the PMOS diode and the first inverting signal equal to or higher than the intermediate voltage by a first preset level is applied to a source and back bias of the PMOS diode, and
   the second switching unit comprises an NMOS diode configured to output the control signal through a drain thereof, when the intermediate voltage is applied to a second gate of the NMOS diode and the second inverting signal equal to or lower than the intermediate voltage by a second preset level is applied to a source and back bias of the NMOS diode.

8. An inverter of a source signal output circuit, comprising:
   a first inverting unit configured to provide a first inverting signal in response to a first input signal;
   a second inverting unit configured to provide a second inverting signal in response to a second input signal; and an output unit configured to output one of the first inverting signal and the second inverting signal as a control signal, wherein the control signal belongs to a first voltage range from a first voltage to a second voltage, the first inverting unit uses an intermediate voltage between the first voltage and the second voltage and outputs the first inverting signal having a second voltage range from the first voltage to the intermediate voltage, the second inverting unit uses the intermediate voltage and outputs the second inverting signal having a third voltage range from the intermediate voltage to the second voltage, and the first inverting unit, the second inverting unit and the output unit are configured to operate in a low voltage range smaller than the first voltage range, wherein the output unit is configured to provide the control signal to a multiplexer for selecting a source signal having the first voltage range.

9. The inverter of claim 8, wherein:
the first inverting unit comprises a first pull-up element and a first pull-down element configured to receive the first input signal and output the first inverting signal by using the first voltage and the intermediate voltage, and the second inverting unit comprises a second pull-up element and a second pull-down element configured to receive the second input signal and output the second inverting signal by using the intermediate voltage and the second voltage.

10. The inverter of claim 9, wherein:
each of the second voltage range and the third voltage range is included in a low voltage range smaller than the first voltage range, and the first pull-up element, the first pull-down element, the second pull-up element and the second pull-down element are configured to operate in the low voltage range.

11. The inverter of claim 8, wherein the output unit comprises:
a first switching unit configured to output the first inverting signal as the control signal when the first inverting signal of the first inverting unit belongs to the first voltage range; and a second switching unit configured to output the second inverting signal as the control signal when the second inverting signal of the second inverting unit belongs to the second voltage range.

12. The inverter of claim 11, wherein:
the first switching unit outputs the first inverting signal as the control signal, when a first gate voltage is fixed by the intermediate voltage and a potential difference between the first inverting signal and the first gate voltage is equal to or higher than a first preset level, and the second switching unit outputs the second inverting signal as the control signal, when a second gate voltage is fixed by the intermediate voltage and a potential difference between the second inverting signal and the second gate voltage is equal to or higher than a second preset level.

13. The inverter of claim 11, wherein:
the first switching unit comprises a PMOS diode configured to output the control signal through a drain thereof when the intermediate voltage is applied to a first gate of the PMOS diode and the first inverting signal equal to or higher than the intermediate voltage by a first preset level is applied to a source and back bias of the PMOS diode, and the second switching unit comprises an NMOS diode configured to output the control signal through a drain thereof, when the intermediate voltage is applied to a second gate of the NMOS diode and the second inverting signal equal to or lower than the intermediate voltage by a second preset level is applied to a source and back bias of the NMOS diode.

\* \* \* \* \*